(12) United States Patent
Rosen

(10) Patent No.: US 6,633,992 B1
(45) Date of Patent: Oct. 14, 2003

(54) GENERALIZED PRE-CHARGE CLOCK CIRCUIT FOR PULSED DOMINO GATES

(75) Inventor: Eitan Rosen, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/476,412

(22) Filed: Dec. 30, 1999

(51) Int. Cl.⁷ .............................. G06F 1/04; H03K 19/00
(52) U.S. Cl. ......................... 713/500; 713/502; 326/93
(58) Field of Search ................................. 713/322, 400, 713/500, 502, 600; 327/100, 141, 200, 225; 326/93, 95, 96, 97, 104

(56) References Cited

U.S. PATENT DOCUMENTS

| | | | | |
|---|---|---|---|---|
| 5,642,061 A | * | 6/1997 | Gorny | 326/97 |
| 5,764,089 A | * | 6/1998 | Partovi et al. | 327/200 |
| 5,798,938 A | * | 8/1998 | Heikes et al. | 716/6 |
| 6,121,807 A | * | 9/2000 | Klass et al. | 327/200 |
| 6,169,422 B1 | * | 1/2001 | Harris et al. | 326/98 |
| 6,182,233 B1 | * | 1/2001 | Schuster et al. | 713/400 |
| 6,252,425 B1 | * | 6/2001 | Blomgren et al. | 326/105 |

* cited by examiner

Primary Examiner—Thomas Lee
Assistant Examiner—Thuan Du
(74) Attorney, Agent, or Firm—Blakely, Sokoloff, Taylor & Zafman LLP

(57) ABSTRACT

A circuit has at least one data input, an enable input, a clock input, and an output. In one embodiment, the circuit is configured to perform a pre-charge function before an evaluate function in response to the enable input.

6 Claims, 4 Drawing Sheets

GENERALIZED PRE-CHARGE CLOCK CIRCUIT FOR PULSED DOMINO GATES

BACKGROUND OF THE INVENTION

1. Field of the Invention

The present invention relates to the field of computer systems and, more specifically, to the field of integrated circuits using pulsed clock signals.

2. Description of the Related Art

Performance goals of processors increase with every generation, and progressively more sophisticated architectures are required to implement their complex functions. Advanced architectures require long pipelines operating at very high frequencies. These higher frequencies demand increased usage of sophisticated circuit design styles like domino or dynamic circuits.

Domino circuits increase the speed performance of logic circuits by reducing the capacitance associated with the use of P-type metal oxide semiconductors ("MOS"). Domino circuits accomplish this by pre-charging a series of logic gates during a first clock phase, or pre-charge cycle, and evaluating the intended logic function during the next clock phase, or evaluation cycle.

A conventional domino or dynamic circuit typically uses one clock signal for both evaluation and pre-charge. For example, when the clock signal is high the circuit evaluates and when the clock signal is low the circuit pre-charges. Thus a circuit performs pre-charge whenever it is not evaluating.

In some implementations it may be beneficial to separate these too functions and use two separate pulsed clock signals. One pulsed clock signal controls the evaluate while the other controls the pre-charge (active low). They should not be active at the same time, or excess current will be drawn from the power supply. The pre-charge operation may be performed after each evaluation, or immediately before each evaluation. However, a problem associated with the conventional dynamic circuit is that the pre-charge operation may have to be performed hastily to prevent charge sharing failures. Reducing pre-charge time requires larger pre-charge devices, which costs circuit area, performance, and power.

Another problem associated with the conventional dynamic circuit is multiple enable signals, such as, for example, evaluate enable signal and pre-charge enable signal. A third problem associated with the conventional dynamic circuit is high soft error rate ("SER"). Soft error occurs when a pre-charged cell is inadvertently discharged due to various reasons, such as, for example, the cell is hit by cosmic rays. Soft error causes the cell to give wrong value because the cell is assumed pre-charged before the evaluation but in fact, the cell has already discharged.

SUMMARY OF THE INVENTION

A circuit has at least one input, a clock input, and an output. In one embodiment, the circuit is configured to perform a pre-charge function before an evaluate function in response to the enable input.

Additional features and benefits of the present invention will become apparent from the detailed description, figures and claims set forth below.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

A method and apparatus for performing a pre-charge before evaluation using pulsed clock signals are disclosed.

In the following description, for purposes of explanation, numerous specific details are set forth in order to provide a thorough understanding of the present invention. It will be apparent, however, to one skilled in the art that the present invention can be practiced without these specific details. In other instances, well-known structures and devices are shown in block diagram form in order to avoid obscuring the present invention.

It is understood that the present invention may be comprised of transistor circuits that are readily manufacturable using well-known CMOS (complementary metal-oxide semiconductor) technology, or other equivalent semiconductor manufacturing processes. In addition, the present invention may be implemented with other manufacturing processes for making digital devices.

While the following discussion of the present invention is presented with respect to implementation in a microprocessor, the present invention is not limited to that implementation. Implementations for generating clock signals for various digital devices such as discrete logic devices, static devices, dynamic devices, memory devices, devices either on the same or separate chips, communications devices, etc., are within the scope of the present invention.

OVERVIEW

In one embodiment, a device includes a circuit, a clock circuit, and a pre-charge circuit. The circuit is a dynamic or domino circuit and it is operated by pulsed clock signals. The clock circuit is configured to generate pulsed clock signals in response to the enable signals. The pulsed clock signals further includes at least pre-charge pulsed clock signals and evaluate pulsed clock signals. The pre-charge circuit is configured to perform a pre-charge before evaluation.

The proposed invention comes to improve some of the shortcomings of the pulsed implementation, while retaining it's benefits. The pre-charge operation is governed by both—the enable signal and the pulsed clock. If enable is not asserted (high) then pre-charge operation will continue after its pulsed time.

Figure 1:
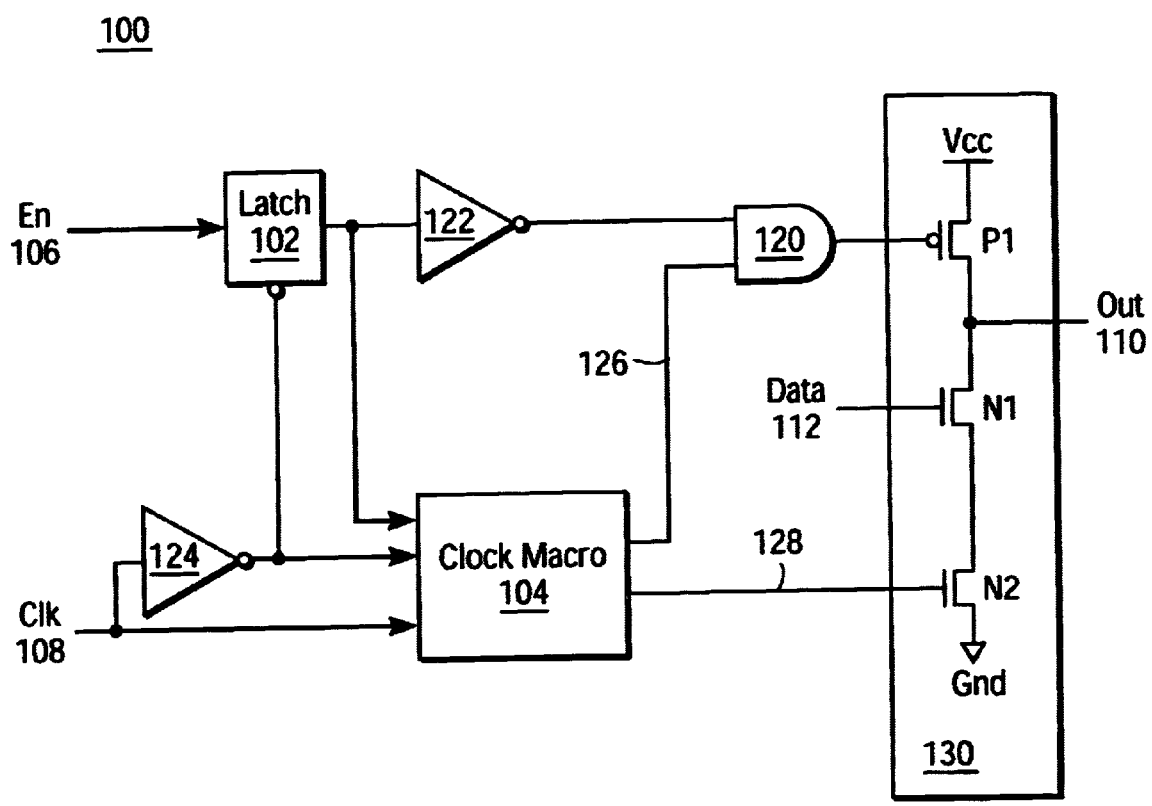
FIG. 1 illustrates one embodiment of a circuit having a pulsed clock generator.

FIG. 1 illustrates one embodiment of a device 100 having a pulsed clock generator. Device 100 includes a logic circuit 130, a clock macro 104, a latch 102, two inverters 122, 124, and an AND gate 120. The logic circuit 130 further includes a p-type transistor P1 and two n-type transistors N1, N2. P-type transistor P1 is a p-channel transistor while an n-type transistor N1 or N2 is an n-channel transistor. Other elements may be added to device 100, but they are not pertinent to understanding device 100.

In one embodiment, logic circuit 130 is a dynamic or domino circuit, which is operated by pulsed clock signals. Logic circuit 130 receives a data 112 and may perform a logic function, such as, for example, a logic NAND or inversion, on data 112. In an alternative embodiment, logic circuit 130 performs a combinational logic function, such as, for example, a multiple-add function. The output 110 of logic circuit 130 could be further coupled to another dynamic circuit.

Clock macro 104 is also known as clock generator or clock circuit, hereinafter referred to as clock circuit. In one embodiment, clock circuit 104 receives a clock signal and an enable signal. The clock signal may be the global or system clock signal. The enable signal, in this embodiment, indicates an evaluate cycle, also known as evaluate phase or evaluate state. The clock circuit 104 generates pulsed clock signals in response to the global clock and the enable input.

In one embodiment, the pulsed clock signals include at least pre-charge pulsed clock signals and evaluate pulsed clock signals. In this embodiment, the pre-charge pulsed clock signals do not overlap with the evaluate pulsed clock signals. In an alternative embodiment, clock circuit 104 contains two components, namely, a pre-charge pulsed clock generator and an evaluate pulsed clock generator.

Device 100 further contains a pre-charge circuit, which is used to pre-charge logic circuit 130. In one embodiment, the pre-charge circuit includes inverter 122 and AND gate 120 and receives various inputs, such as, for example, the enable signal 106 and the pre-charge pulsed clock signal. A function of the pre-charge circuit is to perform a pre-charge before evaluation. In an alternative embodiment, the pre-charge circuit performs a pre-charge function after an evaluation and continues performing the pre-charge function until the next evaluate cycle.

In one operation, latch 102 stores the enable signal 106 during the positive clock cycle. Next, the clock circuit 104 receives the output of latch 102, a clock signal 108, and the complement of the clock signal 108. The clock circuit 104 generates pulsed clock signals in response to the output of latch 102, clock signal 108, and the complement of the clock signal 108. The pulsed clock signals include at least pre-charge pulsed clock signals and evaluate pulsed clock signals. The pre-charge pulsed clock signals are coupled to the input of AND gate 120 via bus 126 while the evaluate pulsed clock signals are coupled to transistor N2 via bus 128. In one embodiment, the pre-charge circuit performs a pre-charges logic circuit 130 before logic circuit 130 is being evaluated. In an alternative embodiment, the pre-charge circuit pre-charges logic circuit 130 after logic circuit 130 is being evaluated and continues pre-charging logic circuit 130 until the next evaluate cycle.

Because of the AND gate 120 and the enable signal 106 being active low, the enable not being active causes pre-charge to constantly take place (and outputs low), irrespective of the negative, opposite phase clock signal carried by bus 126. The signal carried by bus 126 is generated by a second clock generator in the clock macro 104. The first clock generator generates the evaluate pulses in response to the enable signal 106. The second clock generator generates negative pulse that ensures pre-charge will take place in time for the next cycle, even if enable is constantly active (=low). The second clock generator may be enabled or it may be free running.

Figure 2:
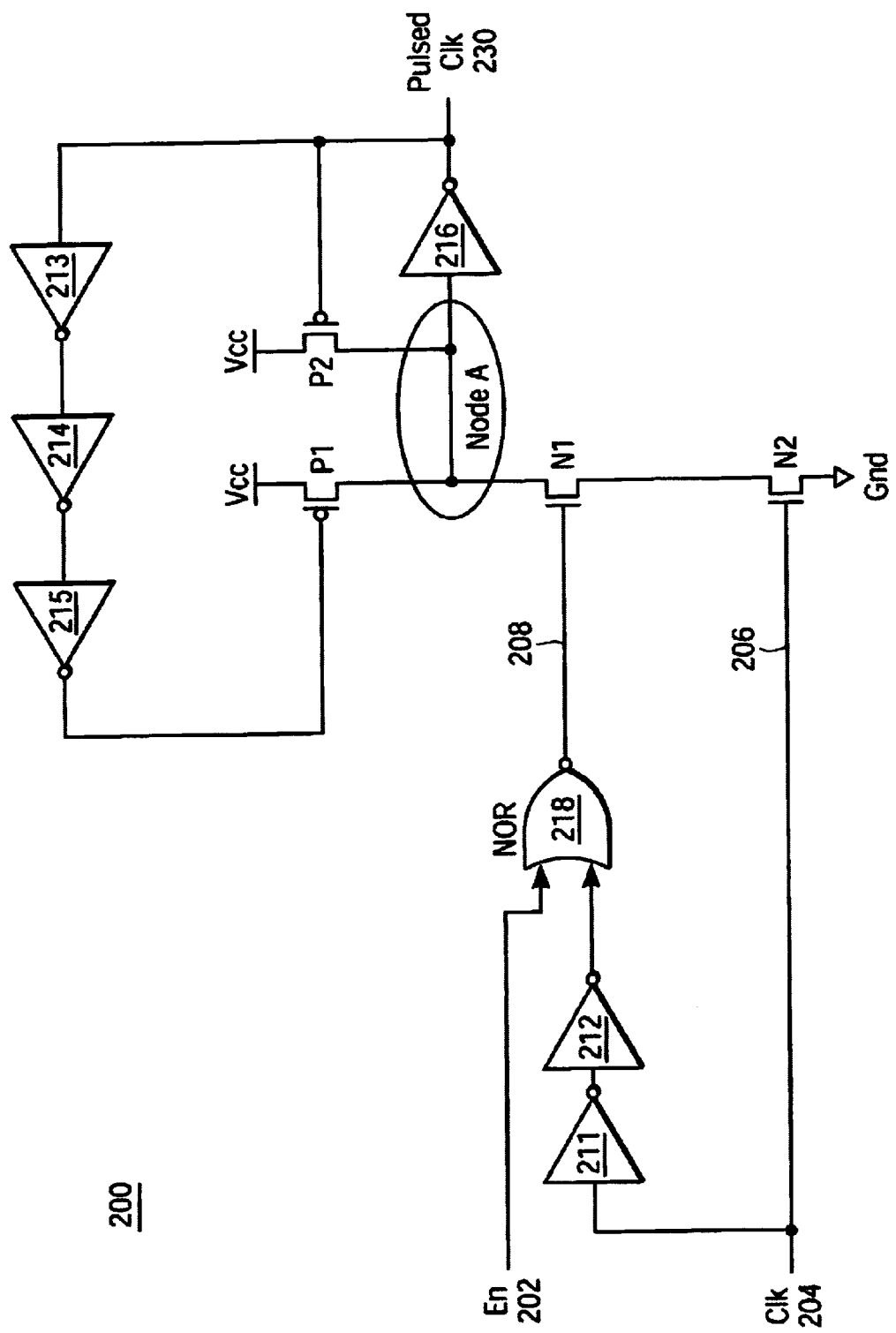
FIG. 2 illustrates one embodiment of a pulsed clock generator.

FIG. 2 illustrates one embodiment of a pulsed clock generator 200. Pulsed clock generator 200 contains six inverters 211–216, a NOR gate 218, two p-type transistors P1, P2, and two n-type transistors N1, N2. Other elements may be added, but they are not pertinent to understanding the disclosed pulsed clock generator 200.

In one embodiment, pulsed clock generator 200 receives an enable signal 202 and a clock signal 204 and generates a pulsed clock signal 230 in response to enable signal 202 and clock signal 204. In this embodiment, the width of the pulsed clock signal 230 is approximately five-gate wide because the four inverters and transistor P1 together make a five-gate delay loop. The waveform of the pulsed clock will be discussed in FIG. 4.

The input of the inverter 211 is coupled to clock signal 204, which may be a system clock, and the output of the inverter 211 is coupled to the input of the inverter 212. The output of the inverter 212 is coupled to the second input of the NOR gate 218 while the first input of NOR gate 218 is coupled to the enable signal 202, which could be a latched enable signal. The output of the NOR gate 218 is coupled to the gate terminal of transistor N1. While the drain terminal of the transistor N1 is coupled to a node A, the source terminal of transistor N1 is coupled to the drain terminal of transistor N2. The source terminal of transistor N2 is coupled to the ground potential of a power supply and the gate terminal of transistor N2 is coupled to clock 204.

The input of the inverter 216 is coupled to the node A while the output of the inverter 216 is the output 230 of the pulsed clock generator 200. Output 230 is also coupled to the input of the inverter 213 and the gate terminal of the transistor P2. The source terminal of the transistor P2 is coupled to a positive potential of a power supply and the drain terminal of transistor P2 is coupled to the node A. In one embodiment, transistor P2 performs a function of retaining the potential level at the node A.

While the output of the inverter 213 is coupled to the input of the inverter 214, the output of the inverter 214 is coupled to the input of the inverter 215. The output of the inverter 215 is coupled to the gate terminal of the transistor P1. While the source terminal of the transistor P1 is coupled to the positive potential of the power supply, the drain terminal of transistor P1 is coupled to the node A.

In one embodiment, clock macro 104, which is illustrated in FIG. 1, contains two pulsed clock generators 200 where the first pulsed clock generator is used for generating pre-charge pulsed clock signals and the second pulsed clock generator is used for generating evaluate pulsed clock signals.

Figure 3:
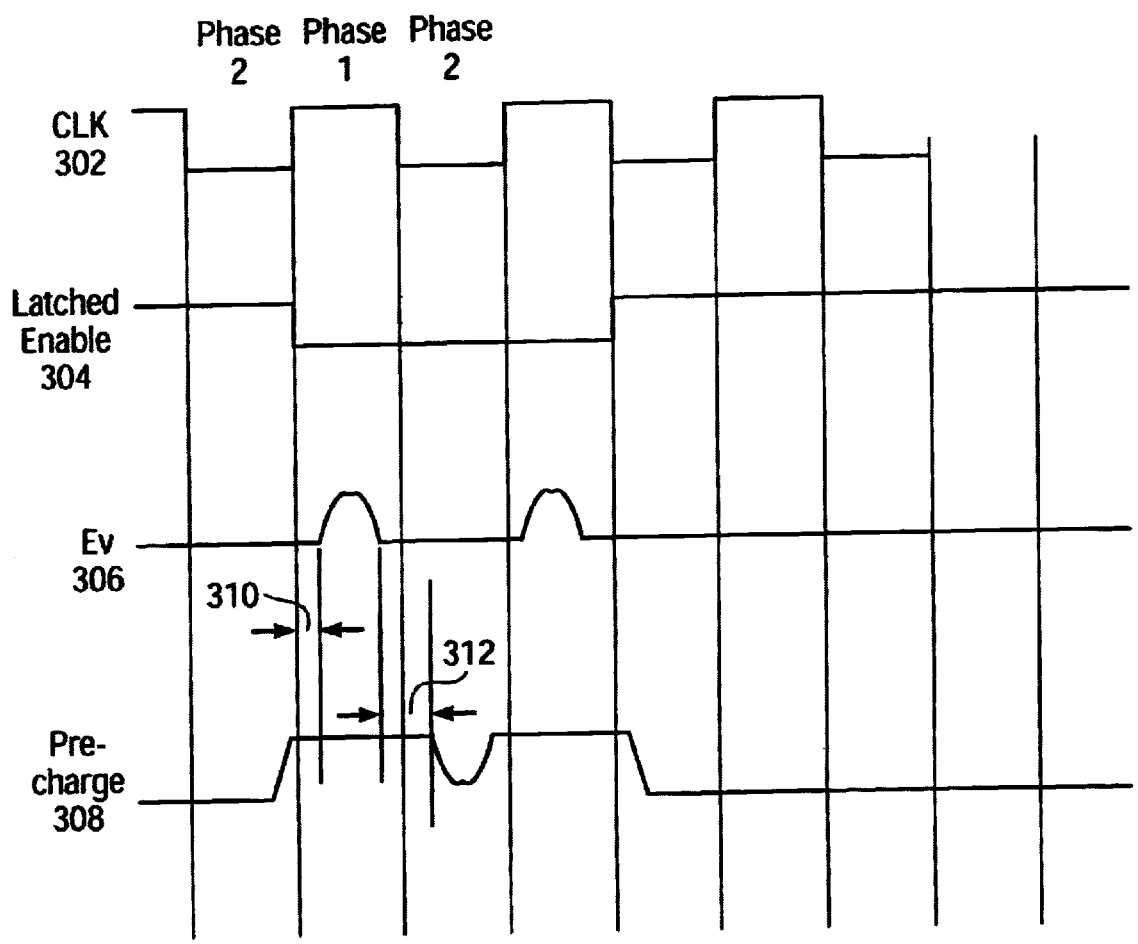
FIG. 3 is a timing diagram illustrating one embodiment of a process having pre-charge and evaluate cycles.

FIG. 3 is a timing diagram 300 illustrating one embodiment of a process having pre-charge and evaluate cycles. Timing diagram 300 includes a clock waveform 302, an enable waveform 304, an evaluate waveform 306, and a pre-charge waveform 308. Other waveforms may be added to timing diagram 300, but they are not pertinent to understanding the present invention.

In one embodiment, clock waveform 302 is a global clock waveform and enable waveform 304 is a latched enable signal. Enable waveform 304 goes active for two cycles. At phase 1, evaluate waveform 306 has a pulse, which indicates an evaluate cycle, while pre-charge waveform 308 shows that pre-charge is inactive. In this embodiment, the circuit, such as, for example, logic circuit 130 in FIG. 1, is evaluated at cycle 2 or phase 1.

In one embodiment, evaluate pulses are generated in response to the enable signal 304 and rising edge of the clock signals. For example, evaluate waveform 306 has two pulses in response to the enable signal 304 and rising edge of the clock signal 302.

In one embodiment, the pre-charge stops for the evaluation phases and resumes the pre-charge when the enable is inactive again. When the enable is active it charges for a pulse following the falling edge of the global clock. In another embodiment, pre-charge waveform 308 is active as long as evaluate waveform 306 is inactive.

In one embodiment, a first delay 310 is generated between the falling edge of pre-charge waveform 308 and the rising edge of evaluate waveform 306. Also, a second delay 312 is created between the falling edge of evaluate waveform 306 and the rising edge of pre-charge waveform 308. The delays 310–312 are used to reduce the possibility of overlapping between evaluate phase and pre-charge phase. Reducing the overlapping between evaluate cycle and pre-charge cycle reduces power consumption and consequently, makes the circuit more efficient.

Figure 4:
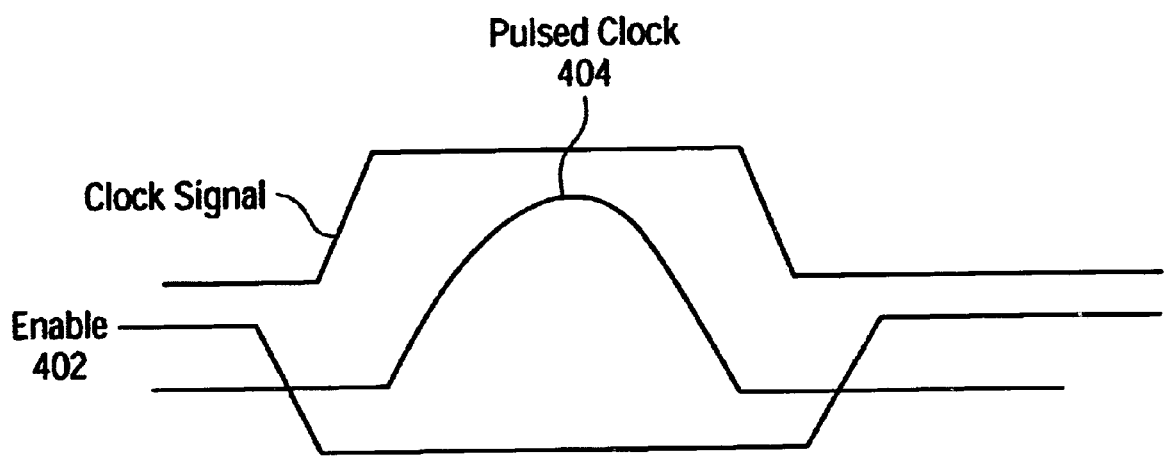
FIG. 4 is a waveform illustrating an enable signal and a pulsed clock signal.

FIG. 4 is a waveform 400 illustrating an enable signal and a pulsed clock signal. Waveform 400 may be illustrated together with FIG. 2, which shows a pulsed clock generator 200. Waveform 400 illustrates a clock signal, an enable waveform 402, and a pulse clock 404. Pulse clock 404 is generated in response to enable waveform 402 and the clock signal. Enable waveform 402, in this embodiment, is a negative enable signal. Negative enable signal means that a logic low is the active mode while a logic high is the inactive mode. The rising edge of pulse 404 may take 2 to 3 gate delays while the falling edge of pulse 404 may take 6 to 7 gate delays to complete. In one embodiment, pulse 404 lasts five inversions independent from the phase duration.

Whereas many alterations and modifications of the present invention will no doubt become apparent to a person of ordinary skill in the art after having read the foregoing description, it is to be understood that the various embodiments shown and described by way of illustration are in no way intended to be considered limiting. Therefore, references to details of various embodiments are not intended to limit the scope of the claims, which in themselves recited only those features regarded as essential to the invention.

Thus, a method and apparatus for performing a pre-charge before evaluation with pulsed clock signals have been described.

What is claimed is:

1. A device comprising:
   a first inverter having an input and an output, the input of the first inverter being coupled to a clock signal;
   a latch having an input, a control input, and an output, the input of the latch being coupled to an input of the device and the control input of the latch being coupled to the output of the first inverter;
   a clock circuit having first, second, third inputs and a first, second outputs, the first input of the clock circuit being coupled to the output of the latch, the second input of the clock circuit being coupled to the output of the first inverter, and the third input of the clock circuit being coupled to the clock signal;
   a second inverter having an input and an output, the input of the second inverter being coupled to the output of the latch;
   a logic AND-gate having a first input, a second input, and an output, the first input of the logic AND-gate being coupled to the output of the second inverter and the second input of the logic AND-gate being coupled to the first output of the clock circuit; and
   a circuit having first, second, third inputs and an output, the first input of the circuit being coupled to the output of the logic AND-gate, the second input of the circuit being coupled to a data input, and the third input of the circuit being coupled to the second output of the clock circuit.

2. The device of claim 1, wherein the clock circuit further includes
   a third inverter having an input and an output, the input of the third inverter being coupled to the clock signal;
   a fourth inverter having an input and an output, the input of the fourth inverter being coupled to the output of the third inverter;
   a logic NOR gate having a first input, a second input, and an output, the first input of the logic NOR gate being coupled to the enable input and the second input of the logic NOR gate being coupled to the output of the fourth inverter;
   a first p-type transistor having source, drain, and gate terminals, the source terminal of the first p-type transistor being coupled to a first power supply, the drain terminal of the first p-type transistor being coupled to a first node;
   a first n-type transistor having source, drain, and gate terminals, the drain terminal of the first n-type transistor being coupled to the first node, the gate terminal of the first n-type transistor being coupled to the output of the logic NOR gate;
   a second n-type transistor having source, drain, and gate terminals, the drain terminal of the second n-type transistor being coupled to the source terminal of the first n-type transistor, the source terminal of the second n-type transistor being coupled to a second power supply, the gate terminal of the second n-type transistor being coupled to the clock signal;
   a fifth inverter having an input and an output, the input of the fifth inverter being coupled to the first node;
   a second p-type transistor having source, drain, and gate terminals, the source terminal of the second p-type transistor being coupled to the first power supply, the drain terminal of the second p-type transistor being coupled to the first node, the gate of the second p-type transistor being coupled to the output of the fifth inverter;
   a sixth inverter having an input and an output, the input of the sixth inverter being coupled to the output of the fifth inverter;
   a seventh inverter having an input and an output, the input of the seventh inverter being coupled to the output of the sixth inverter;
   an eighth inverter having an input and an output, the input of the eighth inverter being coupled to the output of the seventh inverter, the output of the eighth inverter being coupled to the gate terminal of the first p-type transistor.

3. The device of claim 2, wherein the first power supply voltage is Vcc.

4. The circuit of claim 2, wherein the second power supply voltage is ground.

5. The circuit of claim 2, wherein the clock signal is a global clock signal.

6. The circuit of claim 2, wherein the input is an enable input.

* * * * *